(12) United States Patent
Yang

(10) Patent No.: US 7,846,779 B2
(45) Date of Patent: Dec. 7, 2010

(54) POWER DEVICE PACKAGE AND METHOD OF FABRICATING THE SAME

(75) Inventor: Gwi-gyeon Yang, Icheon-si (KR)

(73) Assignees: Fairchild Korea, Bucheon-si, Gyeonggi-do; Semiconductor Ltd. (KR)

( * ) Notice: Subject to any disclaimer, the term of this patent is extended or adjusted under 35 U.S.C. 154(b) by 101 days.

(21) Appl. No.: 12/194,843

(22) Filed: Aug. 20, 2008

(65) Prior Publication Data
US 2009/0218665 A1    Sep. 3, 2009

(30) Foreign Application Priority Data
Feb. 28, 2008    (KR) ..................... 10-2008-0018530

(51) Int. Cl.
| | |
|---|---|
| H01L 21/50 | (2006.01) |
| H01L 21/48 | (2006.01) |
| H01L 21/44 | (2006.01) |
| H01L 23/495 | (2006.01) |
| H01L 23/52 | (2006.01) |
| H01L 23/34 | (2006.01) |

(52) U.S. Cl. .................. 438/123; 257/676; 257/706; 257/723; 257/E23.031; 257/E23.141; 438/121; 438/122

(58) Field of Classification Search ......... 438/121–123; 257/676, 706, 723, E23.031, E23.141
See application file for complete search history.

(56) References Cited

U.S. PATENT DOCUMENTS

| | | | |
|---|---|---|---|
| 6,181,008 B1 * | 1/2001 | Avery et al. ................. 257/723 |
| 6,313,598 B1 * | 11/2001 | Tamba et al. ................. 318/722 |
| 6,703,703 B2 * | 3/2004 | Grant ......................... 257/688 |
| 7,061,080 B2 * | 6/2006 | Jeun et al. .................... 257/676 |
| 7,176,579 B2 * | 2/2007 | Konishi et al. ............... 257/777 |
| 7,529,093 B2 * | 5/2009 | Sakamoto .................... 361/715 |
| 2004/0070060 A1 * | 4/2004 | Mamitsu et al. ............. 257/680 |
| 2005/0167789 A1 * | 8/2005 | Zhuang ....................... 257/659 |

* cited by examiner

*Primary Examiner*—Luan C Thai
(74) *Attorney, Agent, or Firm*—Townsend and Townsend and Crew LLP

(57) ABSTRACT

Provided are a power device package, which can be made compact by mounting semiconductor chips in recesses formed in a substrate and improve operational reliability by rapidly dissipating heat generated during operation to the outside, and a method of fabricating the power device package. The power device package includes: a substrate having a first surface and a second surface opposite to each other, and one or more recesses formed in the first surface; a wiring pattern formed on the first surface of the substrate; one or more power semiconductor chips placed in the recesses and electrically connected to the wiring pattern; a lead frame electrically connected to the wiring pattern; one or more control semiconductor chips electrically connected to the power semiconductor chips to control the power semiconductor chips; and an optional sealing member sealing the substrate, the wiring pattern, the power semiconductor chips, the control semiconductor chips, and at least a part of the lead frame so as to expose the second surface of the substrate.

25 Claims, 6 Drawing Sheets

POWER DEVICE PACKAGE AND METHOD OF FABRICATING THE SAME

CROSS-REFERENCES TO RELATED APPLICATIONS

This application claims the benefit of Korean Patent Application No. 10-2008-0018530, filed on Feb. 28, 2008, in the Korean Intellectual Property Office, the disclosure of which is incorporated herein in its entirety by reference.

BACKGROUND OF THE INVENTION

1. Field of the Invention

The present invention relates to a power device package and a method of fabricating the same, and more particularly, to a power device package, which can be made compact by mounting semiconductor chips in recesses formed in a substrate and can improve operational reliability by rapidly dissipating heat generated during operation to the outside, and a method of fabricating the power device package.

2. Description of the Related Art

As the power electronic industry using a power device, such as a power transistor, an insulated-gate bipolar transistor (IGBT), a MOS transistor, a silicon-controlled rectifier (SCR), a power rectifier, a servo driver, a power regulator, an inverter, or a converter, has been developing, demands for lighter and smaller power products having better performance are increasing.

To meet the demands, smart power modules or intelligent power modules which can integrate not only various power semiconductor chips but also control semiconductor chips, such as integrated circuit chips, for controlling the power semiconductor chips, into one package, have been actively studied.

In general, power device packages have been fabricated by horizontally mounting a plurality of semiconductor chips on a die attach area of a substrate. For example, U.S. Pat. No. 5,703,399 assigned to Mitsubishi discloses a power device package in which power semiconductor chips and control semiconductor chips mounted on one lead frame are molded into one package.

However, since the power semiconductor chips and the control semiconductor chips are horizontally mounted on the lead frame facing a substrate, the sum of at least the thicknesses of the substrate, the lead frame, and the semiconductor chips makes up the total thickness of the power device package, thereby posing a limitation in increasing integration density.

Also, since power device packages generate heat during operation, it is desirable to rapidly dissipate the heat to the outside for reliable operation. Since the generated heat is generally discharged to the outside through a substrate, when a substrate, such as a ceramic substrate, having a low heat transfer coefficient, is used, the ability to transfer heat is limited.

Embodiments of the invention address the above problems, and other problems, individually and collectively.

BRIEF SUMMARY OF THE INVENTION

Embodiments of the present invention provide for a power device package that can be made compact by mounting semiconductor chips in recesses formed in a substrate. This can improve operational reliability by rapidly dissipating heat generated during operation to the outside environment.

Embodiments of the present invention also provide for a method of fabricating a power device package that can be made compact by mounting semiconductor chips in recesses formed in a substrate. This can improve operational reliability by rapidly dissipating heat generated during operation to the outside.

According to an aspect of the present invention, there is provided a power device package comprising: a substrate having a first surface and a second surface opposite to each other, and one or more recesses formed in the first surface; a wiring pattern formed on the first surface of the substrate; one or more power semiconductor chips placed in the recesses and electrically connected to the wiring pattern; a lead frame electrically connected to the wiring pattern; one or more control semiconductor chips electrically connected to the power semiconductor chips to control the power semiconductor chips; and an optional sealing member sealing the substrate, the wiring pattern, the power semiconductor chips, the control semiconductor chips, and at least a part of the lead frame so as to expose the second surface of the substrate.

In some embodiments, the power semiconductor chips may be placed within the one or more recesses so as not to protrude above the first surface or above an uppermost surface of the wiring pattern formed on the first surface.

The power device package may further comprise an adhesive member attaching the power semiconductor chips to inner walls of the recesses. The adhesive member may include a conductive paste, a conductive tape, a solder, a metal epoxy, a metal paste, a resin-based epoxy, a glass tape, a silicone tape, a Teflon tape, a stainless foil tape, a ceramic tape, or a combination thereof.

The power semiconductor chips and the wiring pattern may be electrically connected to each other by using a wire. The wire may include aluminum (Al) or gold (Au).

The wiring pattern may include aluminum, an aluminum alloy, copper, a copper alloy, or a combination thereof. The wiring pattern further includes nickel, gold, or an alloy thereof.

The wiring pattern and the lead frame may be electrically connected to each other by using a solder, a solder paste, a silver (Ag) paste, or a combination thereof. The wiring pattern and the lead frame may be integrally formed with each other.

The power semiconductor chips may include power metal oxide semiconductor field effect transistors (MOSFETs), bipolar junction transistors (BJTs), insulated-gate bipolar transistors (IGBTs), diodes, or combinations thereof.

At least some of the control semiconductor chips are mounted on the lead frame and are electrically connected to the lead frame. The control semiconductor chips may be mounted to be electrically connected to the lead frame in the form of flip chips, or may be electrically connected to the lead frame by using a wire or a solder ball. At least some of the control semiconductor chips may be placed in the recesses and are electrically connected to the wiring pattern. The control semiconductor chips and the wiring pattern may be electrically connected to each other by using a wire.

The substrate may be a printed circuit board (PCB), a ceramic substrate, an insulated metal substrate (IMS), a pre-molded substrate, or a direct bonded copper (DBC) substrate.

The sealing member may include an epoxy molding compound (EMC), a polyimide, a silicone, a silicone rubber, or a combination thereof.

The power device package may further comprise a heat sink attached to the second surface of the substrate and dissipating heat. The heat sink may include aluminum, an aluminum alloy, copper, a copper alloy, $Al_2O_3$, BeO, AlN, SiN, an epoxy-based resin, or a combination thereof.

According to another aspect of an embodiment of the present invention, there is provided a method of fabricating a power device package, the method comprising: preparing a substrate having a first surface and a second surface opposite to each other; forming one or more recesses in the first surface of the substrate; mounting one or more power semiconductor chips in the recesses; mounting one or more control semiconductor chips, which are electrically connected to the power semiconductor chips to control the power semiconductor chips, in the recesses and/or on a lead frame; electrically connecting the power semiconductor chips and the lead frame; and sealing the substrate, the power semiconductor chips, and a part of the lead frame by using a sealing member so as to expose the second surface of the substrate.

The forming of the recesses may comprise: forming a mask layer on the first surface of the substrate; forming a mask pattern by patterning the mask layer so as to expose regions where the recesses are to be formed; etching the substrate by using the mask pattern as an etching mask; and removing the patterned mask layer.

The mounting of the power semiconductor chips may comprise: forming an adhesive member in the recesses; and attaching the power semiconductor chips to inner walls of the recesses by using the adhesive member.

Before mounting the power semiconductor chips, the method may further comprise forming a wiring pattern on the first surface of the substrate. Electrically connecting of the power semiconductor chips and the lead frame may comprise: electrically connecting the power semiconductor chips and the wiring pattern by using a wire; installing a lead frame on the substrate; and electrically connecting the wiring pattern and the lead frame.

After sealing the substrate, the power semiconductor chips, and the part of the lead frame, the method may further comprise: performing trimming to leave only external leads exposed to the outside of the sealing member among leads of the lead frame; and performing forming to bend the external leads.

These and other aspects of embodiments of the invention are described below in the Detailed Description with reference to the Figures.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
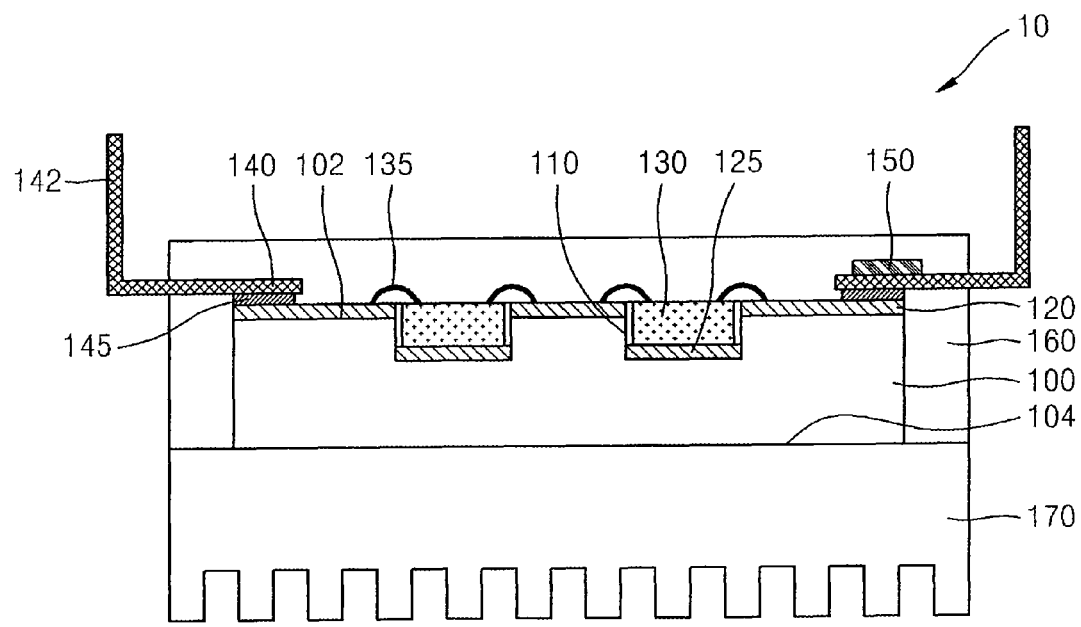
FIG. 1 is a schematic cross-sectional view of a power device package according to an embodiment of the present invention.

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element, such as a layer, a region, or a substrate, is referred to as being "on", "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a power device package 10 according to an embodiment of the present invention.

Referring to FIG. 1, the power device package 10 includes a substrate 100, a wiring pattern 120, one or more power semiconductor chips 130, a lead frame 140, one or more control semiconductor chips 150, and a sealing member 160. The substrate 100 has a first surface 102 and a second surface 104 opposite to each other, and one or more recesses 110 formed in the first surface 102. The wiring pattern 120 is formed on the first surface 102 of the substrate 100. The power semiconductor chips 130 are placed in the recesses 110, and are electrically connected to the wiring pattern 120. The lead frame 140 is electrically connected to the wiring pattern 120. The control semiconductor chips 150 are electrically connected to the power semiconductor chips 130 to control the power semiconductor chips 130. The sealing member 160 seals the substrate 100, the wiring pattern 120, the power semiconductor chips 130, the control semiconductor chips 150, and at least a part of the lead frame 140 so as to expose the second surface 104 of the substrate 100. The power device package 10 may further include a heat sink 170 attached to the second surface 104 of the substrate 100 and dissipating heat.

FIGS. 2A through 2I are schematic cross-sectional views illustrating a method of fabricating the power device package 10 of FIG. 1 according to an embodiment of the present invention.

Figure 2A:
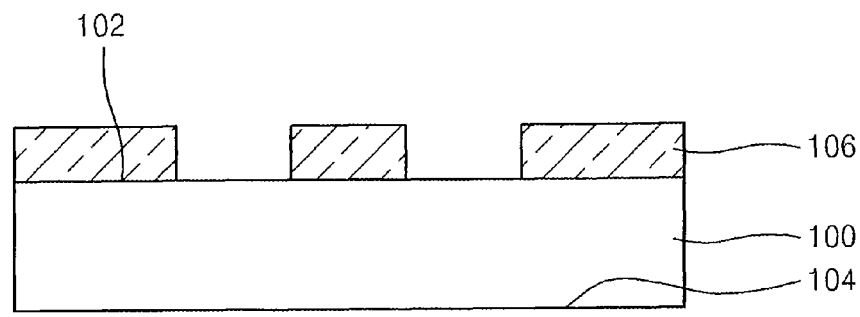
FIGS. 2A through 2I are schematic cross-sectional views illustrating a method of fabricating the power device package of FIG. 1 according to an embodiment of the present invention.

Referring to FIG. 2A, a substrate 100 having a first surface 102 and a second surface 104 opposite to each other is prepared. The substrate 100 may be a printed circuit board (PCB), a ceramic substrate, an insulated metal substrate (IMS), a pre-molded substrate, or a direct bonded copper (DBC) substrate. The substrate 100 may be a conductive substrate provided by a lead frame. The substrate 100 may be formed of a metal-based nitride or a ceramic material. The metal-based nitride may be an aluminum nitride (AlN) or a silicon nitride (SiN), and the ceramic material may be an aluminum oxide ($Al_2O_3$) or a beryllium oxide (BeO). However, the materials are exemplary and the present invention is not limited thereto.

Next, a mask layer (not shown) is formed on the first surface 102. The mask layer is patterned to form a mask pattern 106 through which regions where one or more recesses 110 are to be formed are exposed. The mask pattern 106 may be a typical photoresist pattern or a hard mask pattern such as a silicon oxide layer or a silicon nitride layer. The substrate 100 is etched by using the mask pattern 106 as an etching mask to form one or more recesses 110. The mask pattern 106 is removed by using a typical method.

Figure 2B:
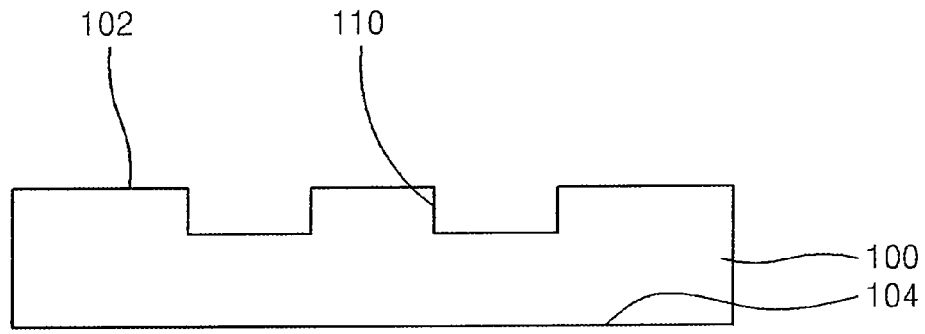

Referring to FIG. 2B, the one or more recesses 110 are formed in the first surface 102 of the substrate 100. The recesses 110 may be formed together by one etching process as described above, or may be formed individually by a plurality of etching processes. The recesses 110 may have the same depth or different depths, unless the power semiconductor chips 130 placed in the recesses 110 protrude above the substrate 110.

Figure 2C:
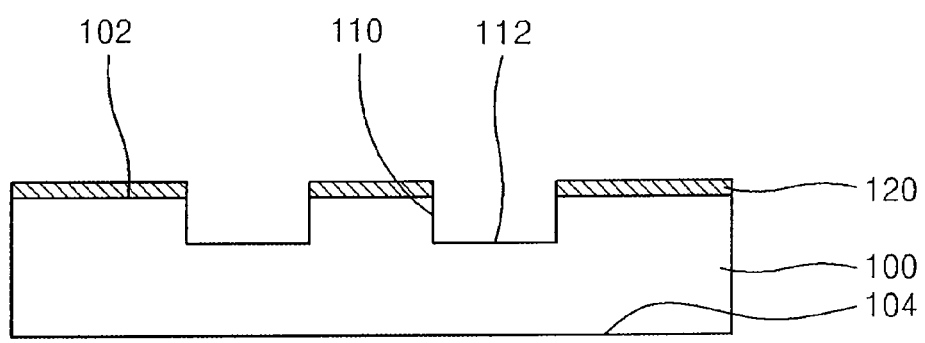

Referring to FIG. 2C, a wiring pattern 120 is formed on the first surface 102 of the substrate 100. The wiring pattern 120 may be formed by a typical film deposition method, such as chemical vapor deposition (CVD) or physical vapor deposition (PVD), or a plating method, such as electroplating or electroless plating. The wiring pattern 120 is formed on only the first surface 102, and is not formed in the recesses 110 in this example. For example, the wiring pattern 120 may be formed by using a mask that blocks regions where the recesses 110 are formed and exposes a region where the wiring pattern 120 is to be formed. Alternatively, the wiring pattern 120 may be formed by filling a photoresist material in the recesses 110 by spin coating, forming a conductive layer on the entire first surface 102 of the substrate 100, and lifting off the conductive layer formed on the recesses 110 by heat treatment or the like.

The wiring pattern 120 may include a conductive material such as a metal. For example, the wiring pattern 120 may include aluminum, an aluminum alloy, copper, a copper alloy, or a combination thereof. The wiring pattern 120 may further include nickel, gold, or an alloy thereof. In other words, when the wiring pattern 120 is formed of a material with poor oxidation resistance, such as copper or a copper alloy, the wiring pattern 120 may be coated with a layer including nickel, gold, or an alloy thereof to prevent oxidation of the copper or copper alloy. However, the materials of the wiring pattern 120 are exemplary and the present invention is not limited thereto.

The forming of the wiring pattern 120 may be optional. That is, when the substrate 100 is a PCB, an IMS, or a DBC substrate as described above, the substrate 100 may already include a pre-formed wiring pattern. In this case, the forming of the wiring pattern 120 may be omitted. However, the pre-formed wiring pattern should be designed in advance to define the regions where the recesses 110 are to be formed.

Figure 2D:
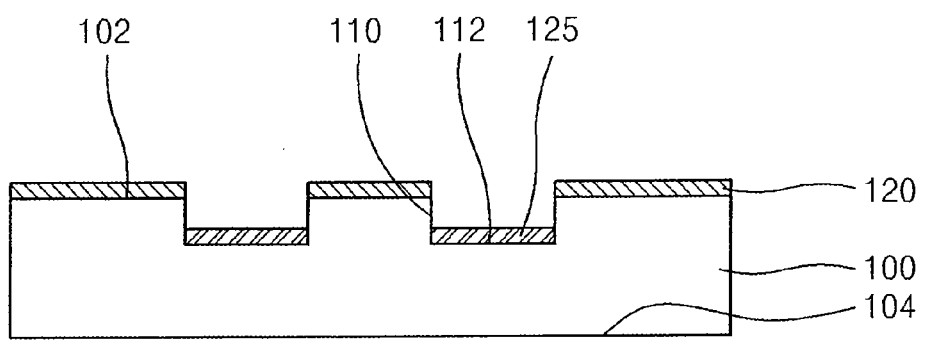

Referring to FIG. 2D, an adhesive member 125 is formed in the recesses 110. The adhesive member 125 may be conductive or non-conductive. For example, the adhesive member 125 may be formed by plating, or may be a conductive paste or a conductive tape. Also, the adhesive member 125 may be a solder, a metal epoxy, a metal paste, a resin-based epoxy, or an adhesive tape with high heat resistance. For example, the adhesive tape may be a well-known high temperature-resistant tape such as a common glass tape, a silicone tape, a Teflon tape, a stainless foil tape, or a ceramic tape. Alternatively, the adhesive member 125 may be formed by combining the aforesaid materials. However, the forming and materials of the adhesive member 125 are exemplary and the present invention is not limited thereto. For example, the forming of the adhesive member 125 may be omitted. Although the adhesive member 125 is formed on only bottom surfaces 112 of the recesses 110 in FIG. 2D, the adhesive member 125 may be formed on only side surfaces of the recesses 110 or may be formed on both the bottom surfaces and the side surfaces of the recesses 110.

Figure 2E:
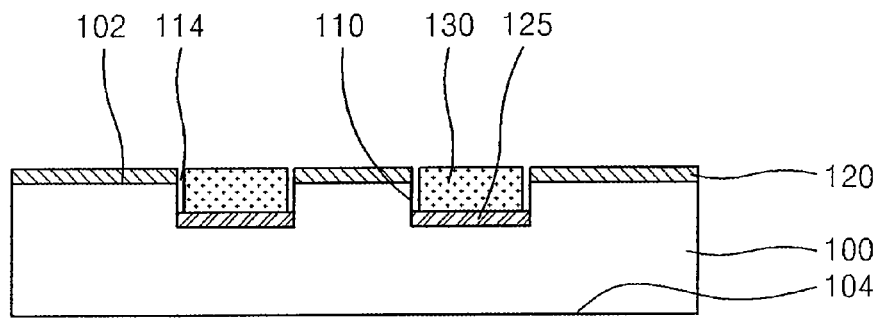

Referring to FIG. 2E, one or more power semiconductor chips 130 are mounted in the recesses 110. The power semiconductor chips 130 may be attached to inner walls of the recesses 110 by using the adhesive member 125. The power semiconductor chips 130 may be mounted in the recesses 110 so as not to protrude above the first surface of the substrate 100 or above an uppermost surface of the wiring pattern 120 formed on the first surface 102. The power semiconductor chips 130 may be mounted to be insulated from the substrate 100 or the wiring pattern 120. To this end, an insulating material may be filled in spaces 114 between side walls of the recesses 110 and the power semiconductor chips 130. A sealing member 160 which will be used later may be used as the insulating material.

The power semiconductor chips 130 may be power circuit chips for power conversion or power control such as servo drivers, inverters, power regulators, or converters. For example, the power semiconductor chips 130 may include power metal oxide semiconductor field effect transistors (MOSFETs), bipolar junction transistors (BJTs), insulated-gate bipolar transistors (IGBTs), diodes, or combinations thereof. In other words, the power semiconductor chips 130 may include any or all of the listed items. For example, two power semiconductor chips 130 shown in FIG. 2E may be an IGBT and a diode, respectively. As such, the power device package 10 may include six power semiconductor chip pairs each including one IGBT and one diode. However, this is exemplary and the present invention is not limited thereto.

Figure 2F:
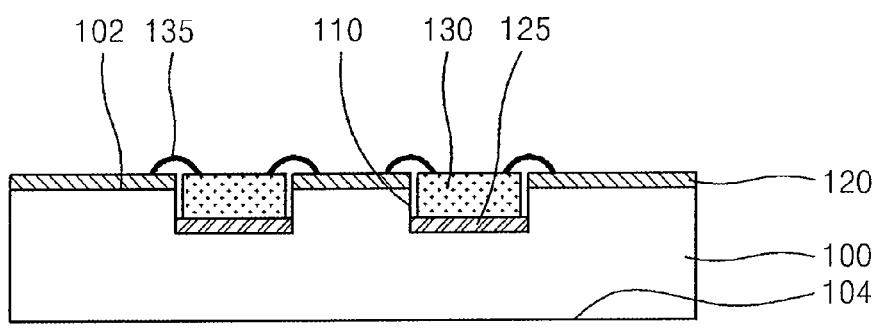

Referring to FIG. 2F, the power semiconductor chips 130 and the wiring pattern 120 are electrically connected to each other by using a wire 135. To this end, each of the semiconductor chips 130 and the wiring pattern 120 may include a connection portion such as a typical connection pad. The wire 135 may include a metal such as aluminum (Al), an aluminum alloy, gold (Au), or a gold alloy. The power semiconductor chips 130 and the wiring pattern 120 may be connected to each other by using the wire 135 by ball bonding, wedge bonding, or stitch bonding which is well known in this art.

Referring to 2G, a lead frame 140 is installed on the substrate 100, and is electrically connected to the wiring pattern 120. The wiring pattern 120 and the lead frame 140 may be electrically connected through a conductive member 145. The conductive member 145 may be a solder, a solder paste, a silver (Ag) paste, or a combination thereof. For this electrical connection, each of the wiring pattern 120 and the lead frame 140 may include a connection portion such as a typical connection pad. However, this is exemplary and the present invention is not limited thereto. That is, although not shown, the wiring pattern 120 and the lead frame 140 may be electrically connected to each other by using a wire. The wiring pattern 120 may be connected to the outside of the power device package 10 through the lead frame 140.

Figure 2G:
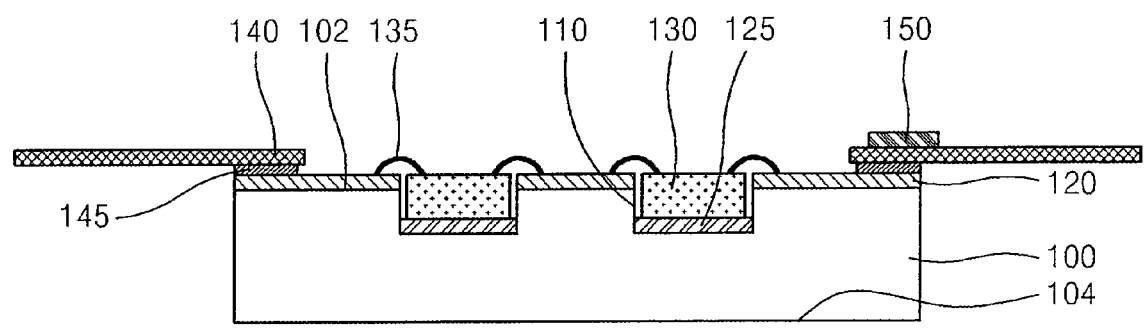

Also, one or more control semiconductor chips 150 electrically connected to the power semiconductor chips 130 to control the power semiconductor chips 130 may be mounted on the lead frame 140. The control semiconductor chips 150 may be electrically connected to the lead frame 140. The control semiconductor chips 150 may be mounted to be electrically connected to the lead frame 140 in the form of flip chips. Alternatively, although not shown, the control semiconductor chips 150 may be electrically connected to the lead frame 140 by using a solder ball or a typical wire, such as a wire including aluminum or gold. For this electrical connection, the control semiconductor chips 150 may include a connection portion such as a typical connection pad. As shown in FIG. 2G, the control semiconductor chips 150 are electrically connected to the power semiconductor chips 130 through the lead frame 140 and the wiring pattern 120, such that the control semiconductor chips 150 can control the operations of the power semiconductor chips 130. The control semiconductor chips 150 may be microprocessors, passive devices, such as resistors, inverters, or condensers, and/or active devices, such as transistors. One power device package 10 may include a few to tens of control semiconductor chips 150. The type and number of the control semiconductor chips 150 can be determined according to the type and number of the power semiconductor chips 130.

The lead frame 140 may be installed on the substrate 100 after the control semiconductor chips 150 are mounted on the lead frame 140, or the control semiconductor chips 150 may be installed on the lead frame after the lead frame 140 is mounted on the substrate 100.

Figure 2H:
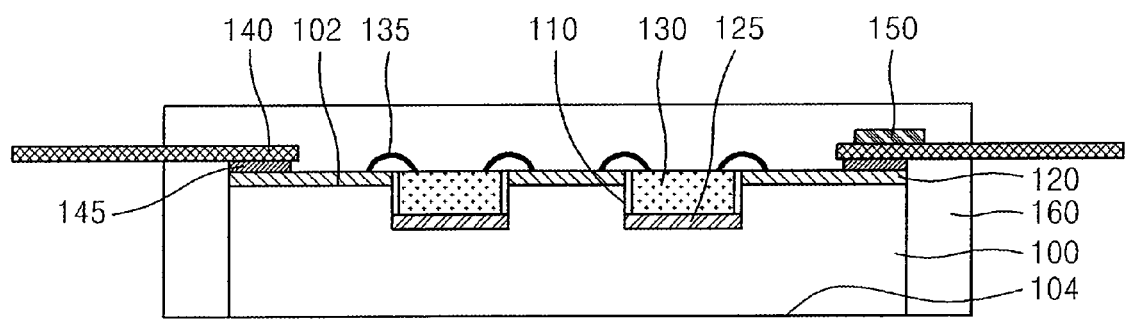

Referring to FIG. 2H, the power device package 10 is encapsulated by using a sealing member 160 by a typical transfer molding process or a curing process. The sealing member 160 may seal the substrate 100, the wiring pattern 120, the power semiconductor chips 130, and the control semiconductor chips 150, and may expose the second surface 104 of the substrate 100. Also, the sealing member 160 seals a part of the lead frame 140, and external leads 142 of the lead frame 140 which are exposed to the outside are electrically connected to the outside of the power device package 10. The sealing member 160 may include an insulating resin, for example, an epoxy molding compound (EMC), a polyimide, a silicone, a silicone rubber, or a combination thereof. The power device package 10 may have various shapes depending on the shape of an external mold in which the sealing member 160 is made.

Figure 2I:
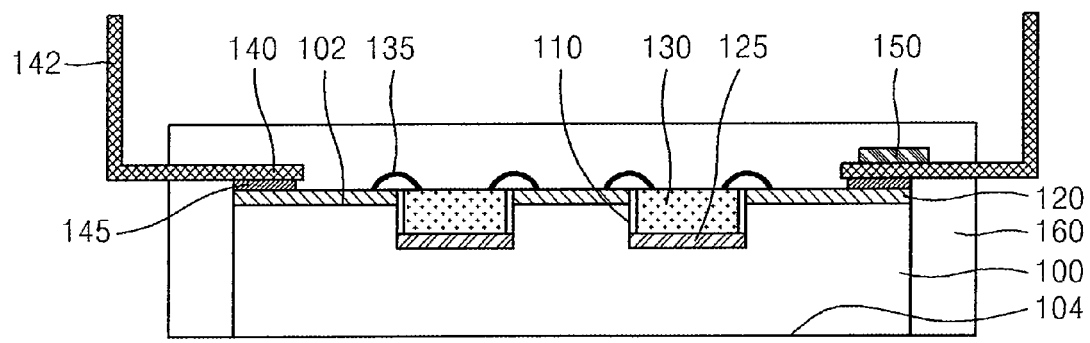

Referring to FIG. 2I, trimming is performed so that only the external leads 142 exposed to the outside of the sealing member 160 among leads of the lead frame 140 are left, and forming is performed to bend the external leads 142, thereby completing the power device package 10.

Referring to FIG. 1 again, the power device package 10 may further include a heat sink 170 attached to the exposed second surface 104 of the substrate 100 and dissipating heat. The heat sink 170 may include a metal, a metal nitride, a ceramic, a resin, or a combination thereof. For example, the heat sink 170 may include aluminum, an aluminum alloy, copper, a copper alloy, an aluminum oxide ($Al_2O_3$), a beryllium oxide (BeO), an aluminum nitride (AlN), a silicon nitride (SiN), an epoxy-based resin, or a combination thereof. The heat sink 170 may have various dimensions and shapes in order to more effectively dissipate heat. The heat sink 170 may be attached to the substrate 100 by using a solder, a metal epoxy, a metal paste, a resin-based epoxy, or an adhesive tape with heat resistance or preferably good heat transfer properties. The adhesive tape may be a well-known high temperature-resistant tape such as a glass tape, a silicone tape, a Teflon tape, a stainless foil tape, or a ceramic tape, or a tape including an aluminum oxide, an aluminum nitride, a silicon oxide, or a beryllium oxide. The solder may include a metal such as lead (Pb), lead/tin (Pb/Sn), tin/silver (Sn/Ag), or lead/tin/silver (Pb/Sn/Ag).

Figure 3:
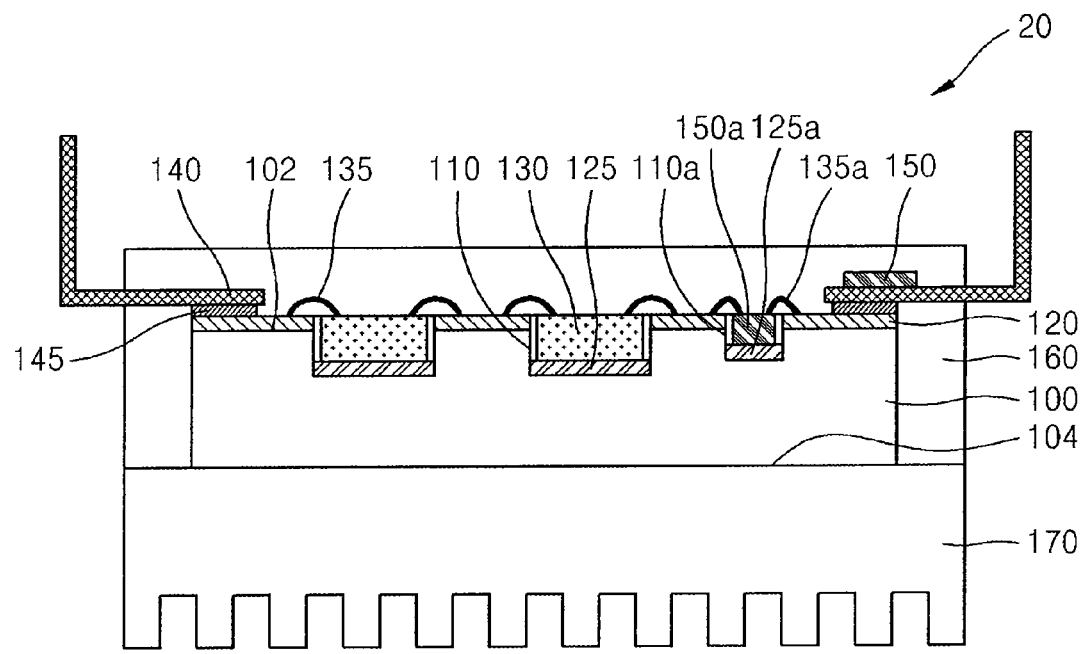
FIG. 3 is a schematic cross-sectional view of a power device package according to another embodiment of the present invention.

FIG. 3 is a schematic cross-sectional view of a power device package 20 according to another embodiment of the present invention. For convenience and accuracy, repeated explanation of similar features will not be given.

Referring to FIG. 3, the power device package 20 is characterized in that control semiconductor chips 150a are placed in recesses 110a of a substrate 100. The mounting and shapes of the control semiconductor chips 150a in the recesses 110a are similar to those of the power semiconductor chips 130 placed in the recesses 110 of FIG. 1. The recesses 110a in which the control semiconductor chips 150a are to be placed may be formed by the same process as that used to form recesses 110 for power semiconductor chips 130 or may be formed by a process different from that used to form the recesses 10 for the power semiconductor chips 130. The control semiconductor chips 150a may be attached to inner walls of the recesses 110a by using an adhesive member 125a. The control semiconductor chips 150a and the power semiconductor chips 130 can be electrically connected to each other. For example, the control semiconductor chips 150a may be electrically connected to the power semiconductor chips 130 through a wiring pattern 120 and a wire 135a. The control semiconductor chips 150a may be mounted in the recesses 110a so as not to protrude above a first surface 102 of the substrate 100 or above an uppermost surface of the wiring pattern 120 formed on the first surface 102. Detailed explanation of the recesses 110a, the adhesive member 125a, and the wire 135a for the mounting of the control semiconductor chips 150a are substantially similar to that of the recesses 110, the adhesive member 125, and the wire 135 of the power semiconductor chips 130 of FIG. 1, and thus will not be given.

Although the control semiconductor chips 150 and 150a are mounted on a lead frame 140 and placed in the recesses 110a of the substrate 100 in FIG. 3, the present invention is not limited thereto. That is, all the control semiconductor chips may be placed in the recesses 110a of the substrate 100 without being mounted on the lead frame 140. Since the power device package 20 of FIG. 3 can place the control semiconductor chips 150a in remaining spaces of the substrate 100, the size, particularly, the height, of the power device package 20 can be reduced.

Figure 4:
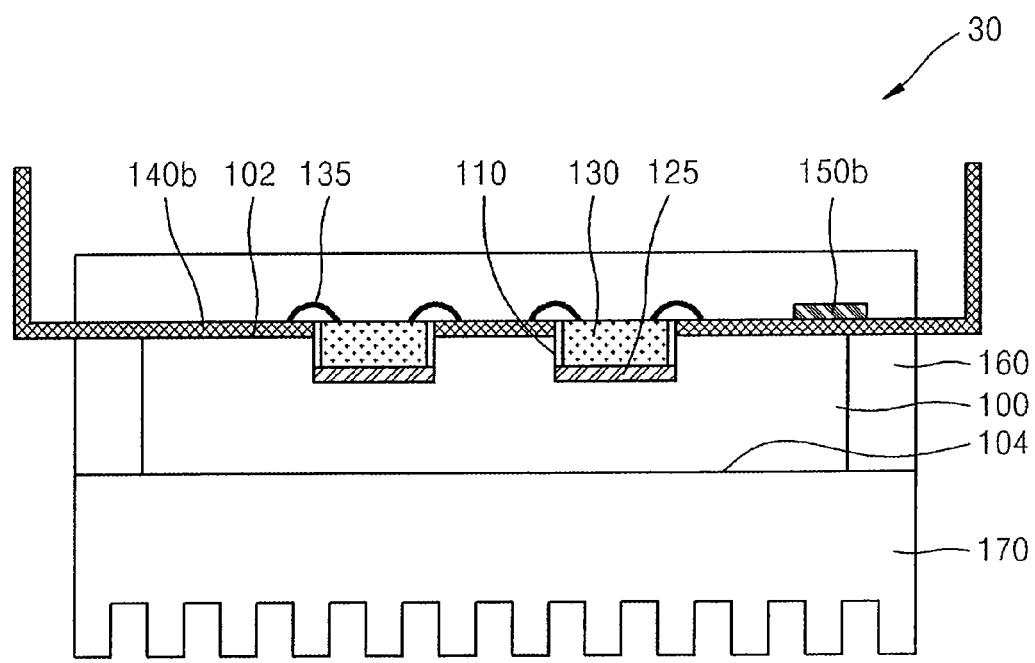
FIG. 4 is a schematic cross-sectional view of a power device package according to another embodiment of the present invention.

FIG. 4 is a schematic cross-sectional view of a power device package 30 according to another embodiment of the present invention. For convenience and accuracy, repeated explanation of previously described features will not be provided.

Referring to FIG. 4, the power device package 30 is characterized in that the wiring pattern 120 of FIG. 1 is integrally formed with a lead frame 140b. Accordingly, the wiring pattern 120 does not need to be formed and electrically connected. The lead frame 140b can be formed to define spaces occupied by power semiconductor chips 130. A method of electrically connecting the power semiconductor chips 130 and the lead frame 140b may be substantially the same as the method of electrically connecting the power semiconductor chips 130 and the wiring pattern 120 of FIG. 1. Although not shown in FIG. 4, in order to reliably attach the lead frame 140b to a first surface 102 of a substrate 100, an additional adhesive member (not shown) may be used. For example, the lead frame 140b may be attached to the first surface 102 of the substrate 100 by using an adhesive, such as a solder or a thermal tape, a welding method, such as laser welding or point welding, or a plating method such as silver (Ag) plating or silver/tin (Ag/Sn) plating.

Figure 5:
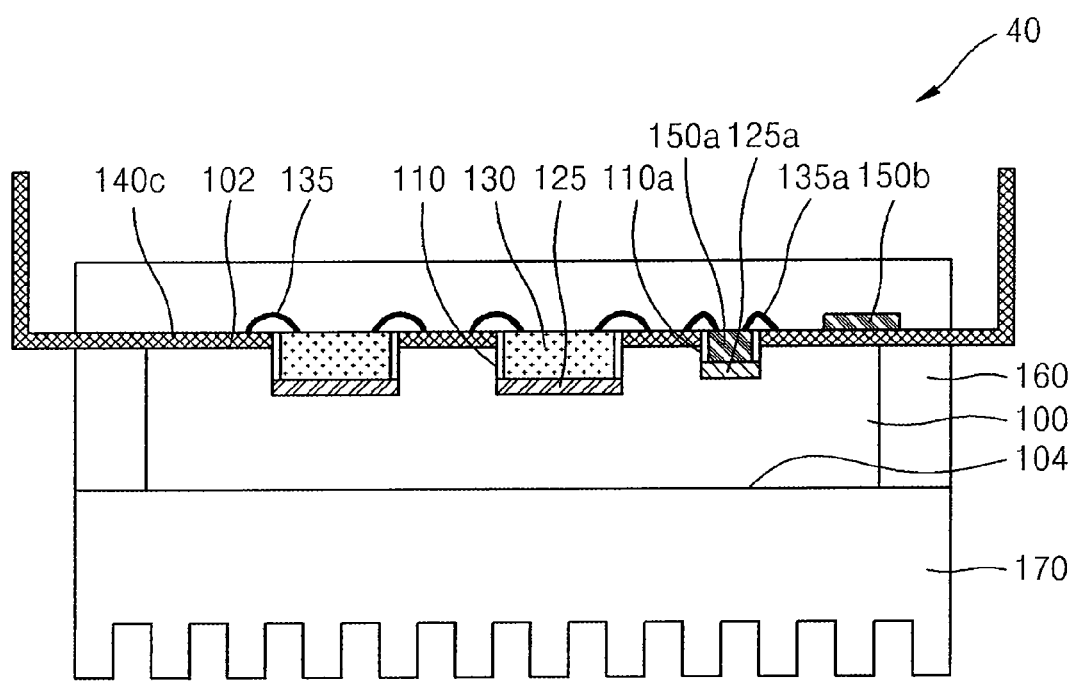
FIG. 5 is a schematic cross-sectional view of a power device package according to another embodiment of the present invention.

FIG. 5 is a schematic cross-sectional view of a power device package 40 according to another embodiment of the present invention. For convenience and accuracy, repeated explanation of similar features will not be given.

Referring to FIG. 5, the power device package 40 is characterized in that the characteristics of the power device package 20 of FIG. 3 and the power device package 30 of FIG. 4 are combined. In other words, control semiconductor chips 150 and 150a are mounted on a lead frame 140c and/or in recesses 110a of a substrate 100. The wiring pattern 120 of FIG. 1 is integrally formed with the lead frame 140c. Accordingly, since the power device package 40 can place the control semiconductor chips 150a in remaining spaces of the substrate 100, the size of the power device package 20 can be reduced. Also, steps of forming and electrically connecting the wiring pattern 120 can be omitted.

As described above, since the power device package according to the above embodiments of the present invention places the power semiconductor chips in the recesses formed in the substrate, the height of the power device package can be reduced. Further, the power device package according to the present invention can rapidly dissipate heat generated during the operation of the power semiconductor chips 130 to the outside. In general, a ceramic substrate has a heat transfer coefficient of approximately 20 to 30 W/mK, an IMS has a heat transfer coefficient of approximately 50 to 100 W/mK, and a DBC substrate has a heat transfer coefficient of approximately 130 to 170 W/mK. Accordingly, for example, when the power device package uses a ceramic substrate, there is a limitation in reducing the thickness of the ceramic substrate and forming a faster heat transfer path inside the power device package due to low heat conductivity. However, the power device package according to the embodiments of the present invention substantially reduces a heat transfer path formed in the substrate because the recesses are formed in the substrate, and accordingly, heat generated due to the operation of the power semiconductor chips can be rapidly dissipated to the outside. Furthermore, since regions of the substrate other than the recesses can be thick, the mechanical strength of the substrate can be maintained.

The power device package according to the present invention can be made compact by mounting the semiconductor chips in the recesses formed in the substrate. Also, since the recesses are formed in the substrate, the heat transfer path in the substrate can be reduced and heat generated during the operation of the power semiconductor chips can be rapidly dissipated to the outside, thereby improving the operational reliability of the power device package.

Moreover, since the power device package according to the present invention puts the power semiconductor chips and the control semiconductor chips for controlling and driving the power semiconductor chips into one package, smart power modules or intelligent power modules can be realized.

The forgoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A power device package comprising:
   a substrate having a first surface and a second surface opposite to each other, and a plurality of recesses formed in the first surface;
   a wiring pattern formed on the first surface of the substrate;
   a plurality of semiconductor chips placed in the recesses and electrically connected to the wiring pattern;
   a lead frame electrically connected to the wiring pattern; and one or more control semiconductor chips electrically connected to the power semiconductor chips to control the power semiconductor chips; and wherein each of the plurality of power semiconductor chips is placed in a respective one of the plurality of recesses.

2. The power device package of claim 1, wherein the power semiconductor chips are placed so as not to protrude above the first surface or above an uppermost surface of the wiring pattern formed on the first surface, and wherein the power device package further comprises a sealing member sealing the substrate, the wiring pattern, the power semiconductor chips, the control semiconductor chips, and at least a part of the lead frame so as to expose the second surface of the substrate.

3. The power device package of claim 1, further comprising an adhesive member attaching the power semiconductor chips to inner walls of the recesses.

4. The power device package of claim 3, wherein the adhesive member comprises a conductive paste, a conductive tape, a solder, a metal epoxy, a metal paste, a resin-based epoxy, a glass tape, a silicone tape, a Teflon tape, a stainless foil tape, a ceramic tape, or a combination thereof.

5. The power device package of claim 1, wherein the power semiconductor chips and the wiring pattern are electrically connected to each other by using a wire.

6. The power device package of claim 5, wherein the wire comprises aluminum (Al) or gold (Au).

7. The power device package of claim 1, wherein the wiring pattern comprises aluminum, an aluminum alloy, copper, a copper alloy, or a combination thereof.

8. The power device package of claim 7, wherein the wiring pattern further comprises nickel, gold, or an alloy thereof.

9. The power device package of claim 1, wherein the wiring pattern and the lead frame are electrically connected to each other by using a solder, a solder paste, a silver (Ag) paste, or a combination thereof.

10. The power device package of claim 1, wherein the wiring pattern and the lead frame are integrally formed with each other.

11. The power device package of claim 1, wherein the power semiconductor chips comprise power metal oxide semiconductor field effect transistors (MOSFETs), bipolar junction transistors (BJTs), insulated-gate bipolar transistors (IGBTs), diodes, or combinations thereof.

12. The power device package of claim 1, wherein at least some of the control semiconductor chips are mounted on the lead frame and are electrically connected to the lead frame.

13. The power device package of claim 12, wherein the control semiconductor chips are mounted to be electrically connected to the lead frame in the form of flip chips, or are electrically connected to the lead frame by using a wire or a solder ball.

14. The power device package of claim 1, wherein at least some of the control semiconductor chips are placed in the recesses and are electrically connected to the wiring pattern.

15. The power device package of claim 14, wherein the control semiconductor chips and the wiring pattern are electrically connected to each other by using a wire.

16. The power device package of claim 1, wherein the substrate is a printed circuit board (PCB), a ceramic substrate, an insulated metal substrate (IMS), a pre-molded substrate, or a direct bonded copper (DBC) substrate.

17. The power device package of claim 2, wherein the sealing member comprises an epoxy molding compound (EMC), a polyimide, a silicone, a silicone rubber, or a combination thereof.

18. The power device package of claim 1, further comprising a heat sink attached to the second surface of the substrate.

19. The power device package of claim 18, wherein the heat sink comprises aluminum, an aluminum alloy, copper, a copper alloy, $Al_2O_3$, BeO, AlN, SiN, an epoxy-based resin, or a combination thereof.

20. A method of fabricating a power device package, the method comprising:

preparing a substrate having a first surface and a second surface opposite to each other, and a wiring pattern formed on the first surface of the substrate;

forming a plurality of recesses in the first surface of the substrate;

mounting a plurality of power semiconductor chips in the recesses such that each of the plurality of power semiconductor chips is placed in a respective one of the plurality of recesses;

electrically connecting a lead frame electrically to the wiring pattern;

mounting one or more control semiconductor chips, which are electrically connected to the power semiconductor chips to control the power semiconductor chips, in the recesses and/or on a lead frame; and electrically connecting the power semiconductor chips and the lead frame.

21. The method of claim 20, wherein the forming of the recesses comprises:

forming a mask layer on the first surface of the substrate;

forming a mask pattern by patterning the mask layer so as to expose regions where the recesses are to be formed;

etching the substrate by using the mask pattern as an etching mask; and removing the patterned mask layer.

22. The method of claim 20, wherein the mounting of the power semiconductor chips comprises:

forming an adhesive member in the recesses; and attaching the power semiconductor chips to inner walls of the recesses by using the adhesive member.

23. The method of claim 20, before the mounting of the power semiconductor chips, the method further comprising forming a wiring pattern on the first surface of the substrate.

24. The method of claim 23, wherein the electrically connecting of the power semiconductor chips and the lead frame comprises:

electrically connecting the power semiconductor chips and the wiring pattern by using a wire;

installing a lead frame on the substrate; and electrically connecting the wiring pattern and the lead frame.

25. The method of claim 20, further comprising:

sealing the substrate, the power semiconductor chips, and a part of the lead frame by using a sealing member so as to expose the second surface of the substrate, performing trimming to leave only external leads exposed to the outside of the sealing member among leads of the lead frame; and performing forming to bend the external leads.

* * * * *